(12) United States Patent
Meisner et al.

(10) Patent No.: US 9,176,194 B2
(45) Date of Patent: Nov. 3, 2015

(54) TEMPERATURE COMPENSATION FOR MAGNETIC DETERMINATION METHOD FOR THE STATE OF CHARGE OF A BATTERY

(75) Inventors: Gregory P. Meisner, Ann Arbor, MI (US); Mark W. Verbrugge, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 696 days.

(21) Appl. No.: 12/900,914

(22) Filed: Oct. 8, 2010

(65) Prior Publication Data

US 2012/0086457 A1 Apr. 12, 2012

(51) Int. Cl.
*G01N 27/416* (2006.01)
*G01R 31/36* (2006.01)
*H01M 10/48* (2006.01)

(52) U.S. Cl.
CPC ........ *G01R 31/3606* (2013.01); *G01R 31/3675* (2013.01); *H01M 10/486* (2013.01)

(58) Field of Classification Search
CPC .................................................. H01M 10/486
USPC .......... 324/426, 430, 431, 434, 244; 320/150, 320/153
See application file for complete search history.

(56) References Cited

U.S. PATENT DOCUMENTS

| | | | |
|---|---|---|---|
| 5,795,664 A * | 8/1998 | Kelly ................................. | 429/7 |
| 6,535,824 B1 * | 3/2003 | Mansky et al. ................... | 506/8 |
| 7,164,257 B2 * | 1/2007 | Johnson et al. ................ | 320/134 |
| 7,358,716 B2 * | 4/2008 | Preusse et al. ............. | 324/117 R |
| 7,791,216 B2 * | 9/2010 | Xu et al. ......................... | 307/9.1 |
| 7,847,515 B2 * | 12/2010 | Schroeck et al. ................ | 320/106 |
| 8,058,876 B2 * | 11/2011 | Cernasov et al. ............. | 324/426 |
| 8,169,195 B1 * | 5/2012 | Chait et al. ..................... | 320/152 |
| 8,183,870 B1 * | 5/2012 | Davies .......................... | 324/434 |
| 2004/0145352 A1 * | 7/2004 | Harrison ....................... | 320/150 |
| 2005/0253561 A1 * | 11/2005 | Tibbs .............................. | 320/150 |
| 2006/0060236 A1 * | 3/2006 | Kim ............................... | 136/203 |
| 2006/0132141 A1 * | 6/2006 | Dougherty et al. ........... | 324/435 |
| 2006/0284618 A1 * | 12/2006 | Cho et al. ...................... | 324/430 |
| 2007/0257659 A1 * | 11/2007 | Nomoto et al. ............. | 324/76.11 |
| 2007/0284159 A1 * | 12/2007 | Takami et al. ............... | 180/65.1 |
| 2008/0048662 A1 * | 2/2008 | Hirsch et al. ................. | 324/430 |

(Continued)

FOREIGN PATENT DOCUMENTS

CN 101055298 A 10/2007
WO WO 2009/146547 A1 * 12/2009

OTHER PUBLICATIONS

Chinese Office Action dated Dec. 24, 2013; Applicant: GM Global Technology Operations LLC; Application No. 201110296415.4; 6 pages.

(Continued)

*Primary Examiner* — Huy Q Phan
*Assistant Examiner* — Giovanni Astacio-Oquendo
(74) *Attorney, Agent, or Firm* — BrooksGroup

(57) ABSTRACT

An exemplary embodiment includes a method of determining a state of charge of a battery system including determining a temperature dependent magnetic property value of a magnetic material proximate a battery cell; determining a temperature compensated value of said determined magnetic property value; and, using said temperature compensated value as an input to a state of charge (SOC) estimator to determine a state of charge (SOC) of said battery system.

20 Claims, 6 Drawing Sheets

(56) References Cited

U.S. PATENT DOCUMENTS

2008/0079391 A1* 4/2008 Schroeck et al. ............. 320/106
2009/0115420 A1* 5/2009 Koch et al. .................... 324/432
2009/0130545 A1* 5/2009 Wood et al. .................... 429/90
2009/0315564 A1   12/2009 Cernasov et al.
2010/0291416 A1* 11/2010 Verbrugge et al. ............. 429/50
2011/0074432 A1*  3/2011 Tinnemeyer .................. 324/426

OTHER PUBLICATIONS

Chinese Office Action dated Jan. 9, 2015; Applicant: GM Global Technology Operations LLC; Application No. 201110296415.4; 6 pages.

* cited by examiner

US 9,176,194 B2

TEMPERATURE COMPENSATION FOR MAGNETIC DETERMINATION METHOD FOR THE STATE OF CHARGE OF A BATTERY

TECHNICAL FIELD

The field to which the disclosure relates includes methods for determining a state of charge (SOC) in a battery system including a lithium ion battery system.

BACKGROUND

Lithium ion batteries are a type of rechargeable battery in which a lithium ion moves between a negative electrode and a positive electrode. Lithium ion batteries are commonly used in consumer electronics. In addition to uses for consumer electronics, lithium ion batteries are growing in popularity for defense, automotive, and aerospace applications due to their high energy density.

SUMMARY OF EXEMPLARY EMBODIMENTS OF THE INVENTION

One exemplary embodiment includes a method of determining a state of charge (SOC) of a battery system, the method including determining a temperature dependent magnetic property value of a magnetic material proximate a battery cell, said magnetic property value dependent on a state of charge (SOC) of said battery cell; determining a temperature compensated magnetic material value from said temperature dependent magnetic property value; and, using said temperature compensated value as an input to a state of charge (SOC) estimator to determine a state of charge (SOC) of said battery system.

Another exemplary embodiment includes a battery system including a battery cell including a magnetic material; a magnetic property sensor proximate said magnetic material to sense a temperature dependent magnetic property value of said magnetic material, said magnetic sensor in communication with a controller; a temperature sensor proximate said magnetic material to sense a temperature, said temperature sensor in communication with a controller; wherein said controller comprises software to determine a temperature compensated magnetic property value from said temperature dependent magnetic property value.

Another exemplary embodiment includes a method of determining a state of charge (SOC) of a battery system including determining a temperature dependent magnetic property value of a first magnetic material proximate a battery cell, said magnetic property value dependent on a state of charge (SOC) of said battery cell; determining a temperature dependent reference magnetic property value of a second magnetic material, said reference magnetic property value independent of a state of charge (SOC) of said battery cell, said second magnetic material substantially the same as said first magnetic material, said second magnetic material in thermal equilibrium with said battery cell; determining a temperature compensated value of said magnetic material; and, using said temperature compensated value as an input to a state of charge (SOC) estimator to determine a state of charge (SOC) of said battery system Other exemplary embodiments will become apparent from the detailed description provided hereinafter. It should be understood that the detailed description and specific examples, while disclosing exemplary embodiments, are intended for purposes of illustration only and are not intended to limit the scope of the invention.

BRIEF DESCRIPTION OF THE DRAWINGS

Exemplary embodiments of the invention will become more fully understood from the detailed description and the accompanying drawings, wherein.

DETAILED DESCRIPTION OF EXEMPLARY EMBODIMENTS

Figure 1A:
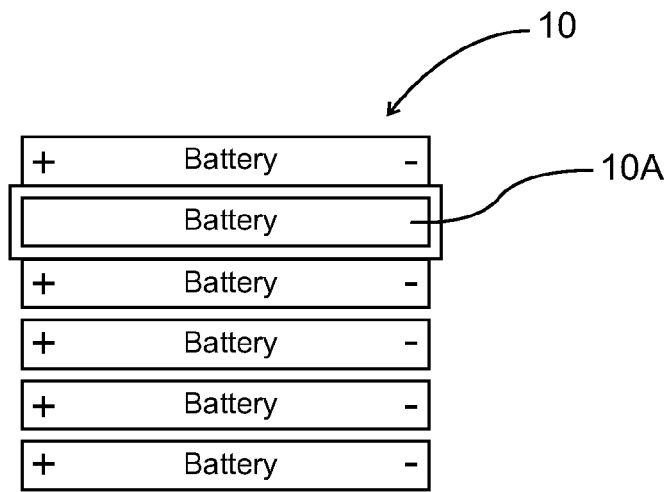
FIG. 1A is a schematic views of an exemplary battery system including multiple lithium ion battery cells according to the prior art.

The following description of the embodiment(s) is merely exemplary (illustrative) in nature and is in no way intended to limit the invention, its application, or uses.

In one embodiment, a temperature of a battery system including a battery electrode is determined in order to control a temperature of the battery system and/or determine a temperature contribution to a measured magnetic property change in the battery system in order to thereby determine an accurate state of charge (SOC) of a battery system.

In one embodiment, the SOC of a battery cell and/or battery system may be determined by a method including determining magnetic properties of magnetic material included in the battery cell and/or battery system. In another embodiment, the magnetic properties of one or more electrodes may be determined. In another embodiment, the magnetic property of a cathode (on discharge) electrode may be determined. In another embodiment, the cathode (on discharge) electrode may include a lithium containing iron phosphate cathode (e.g., $Li_xFePO_4$ where $0<x<1$ between a charged and discharged state). It will be appreciated that in other embodiments, a battery cell may further include a graphite anode (e.g., $Li_yC_6$ where $0<y<1$ between a charged and discharged state).

In some embodiments, the battery system may include one or more lithium ion battery cells. In one embodiment, the battery system may include a plurality of lithium ion battery cells connected in series. In other embodiments, the battery cell may be a portion of a vehicle battery system such as providing power in an electric or hybrid vehicle.

In some embodiments the temperature of one or more of the battery cells in the battery system may be determined together with a measured magnetic property value of the same or different battery cell. A temperature contribution to the magnetic property value may then be determined and a compensated (corrected) magnetic property value determined by correcting for (e.g., removing) the temperature contribution portion of the measured magnetic property value. The compensated (corrected) magnetic property value may then be used as an input to a conventional state of charge (SOC) estimator to determine an SOC of the battery system.

For example, it will be appreciated that SOC estimators may be software implemented in a computer system (e.g., including a controller with a processor and memory) where the SOC estimator may use as additional or alternative inputs to a compensated magnetic property value one or more of voltage measurements including open circuit voltage of one or more battery cells, current measurements, and temperature measurements. It will be appreciated that determination of an SOC value by the SOC estimator may include determining related properties such as a state of power and/or a state of health of a battery system, as is known in the art.

In some embodiments, a magnetic property value of a material within the battery cell, such as an electrode material of the battery cell, may be measured. In one embodiment, the measured magnetic property value may then be temperature compensated (corrected for temperature contributions to the measured magnetic property value) and the temperature compensated (corrected) magnetic property value may then be used alone or in combination with additional input values to an SOC estimator including one or more of voltage, current, and temperature measurements of one or more battery cells in a battery system, to thereby determine an SOC of the battery system.

In some embodiments, the magnetic property may be determined by one or more sensors as are known in the art, including determination of magnetic properties including one or more of magnetic susceptibility, magneto-restrictive properties, and/or magneto-optical properties (e.g., Kerr effect).

For example, referring to FIG. 1A is shown a schematic of a typical exemplary battery system 10 including a plurality of battery cells e.g., 10A, e.g., connected in series to produce a desired output voltage.

Figure 1B:
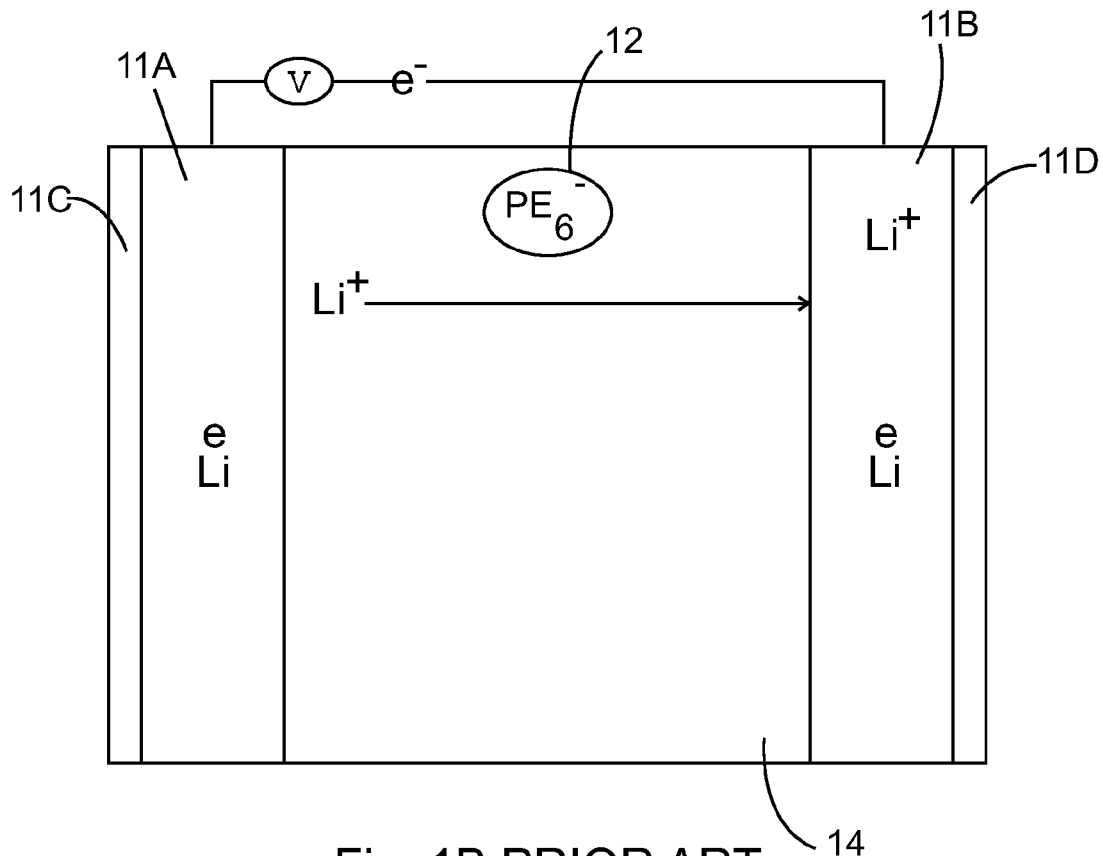
FIG. 1B is a schematic view of an exemplary lithium ion battery cell according to the prior art.

For example, referring to FIG. 1B is shown a schematic of a typical exemplary thin film lithium ion battery cell having a solid state positive electrode (the cathode on discharge) 11A which may be adjacent a separator 14 which may be a porous woven polymer (e.g., propylene and ethylene) containing a liquid electrolyte 12 (e.g., hydrocarbon solution of lithium salt e.g., $LiPF_6$) and which may also be adjacent a solid state negative electrode (the anode on discharge) 11B. The electrodes may include a metal current collector e.g., 11C, 11D onto which host electrode materials (e.g., metal oxide anode and graphite cathode) are respectively attached. For example, the host electrode materials may be porous material thin films formed of particles held together by a conductive binder. The separator 14 may have a thickness on the order of or less than the electrode thickness (e.g., 10-100 microns).

Figure 2A:
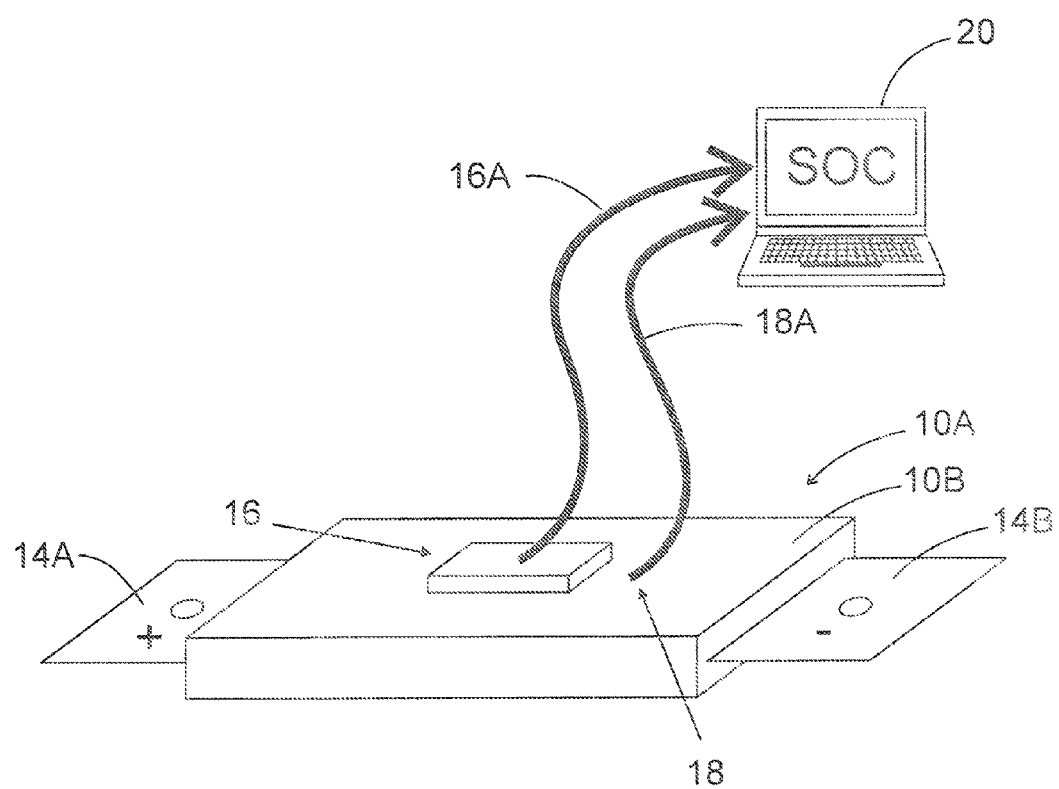
FIG. 2A is a schematic view of an exemplary lithium ion battery cell including magnetic and temperature sensors according to an exemplary embodiment.

Referring to FIG. 2A, a single battery cell 10A is shown including positive 14A and negative 14B electrode leads extending from the battery cell casing. One or more magnetic response (property) sensors e.g., 16 may be in thermal equilibrium (e.g., good thermal contact) with the battery cell 10A. In some embodiments, one or more of the magnetic response sensors e.g., 16 may be physically attached to an external portion of the battery cell container 10B. In other embodiments, one or more of the magnetic response sensors may be placed within the battery cell container 10B including proximate or physically attached to a magnetic material inside the battery cell container e.g., in contact with an electrode material, e.g., a cathode (on discharge).

In some embodiments, one or more temperature sensors e.g., 18 may be in thermal equilibrium (e.g., in good thermal contact) with the battery cell 10A. In some embodiments, the one or more temperature sensors e.g., 18 may be physically attached to an external portion of the battery cell container 10B and may be proximate or physically attached to the magnetic sensor e.g., 16. In other embodiments, the one or more of the temperature sensors may be placed within the battery cell container 10B including proximate or physically attached to the magnetic material and/or magnetic sensor. It will be appreciated that in the case the temperature sensors are attached to the magnetic response sensors that the attachment may be made to avoid any interference by the temperature sensors with operation of the magnetic response sensors.

Still referring to FIG. 2A, in some embodiments, response signals e.g., 16A, 18A from respective magnetic response sensor e.g., 16 and temperature sensor e.g., 18 may be provided to a controller 20, which may be equipped with a processor and which may be capable of executing preprogrammed instructions (software) from memory as well as storing and/or outputting results. In some embodiments, the controller 20 may include executable software programmed to determine a state of charge (SOC) of the battery from signal inputs which may include a temperature compensated magnetic property value. In addition, controller may execute the same or separate software programmed to derive a temperature compensated magnetic property value from a measured magnetic property value supplied by the magnetic response sensor e.g., 16 and which may then be used as input to the SOC software.

Figure 3A:
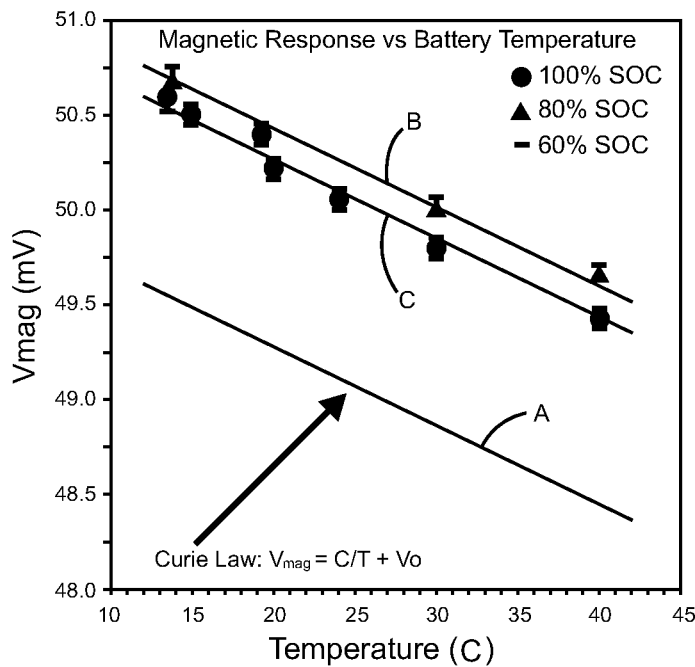
FIG. 3A is a graph showing temperature dependent magnetic property response of a magnetic material according to an exemplary embodiment.
Figure 3B:
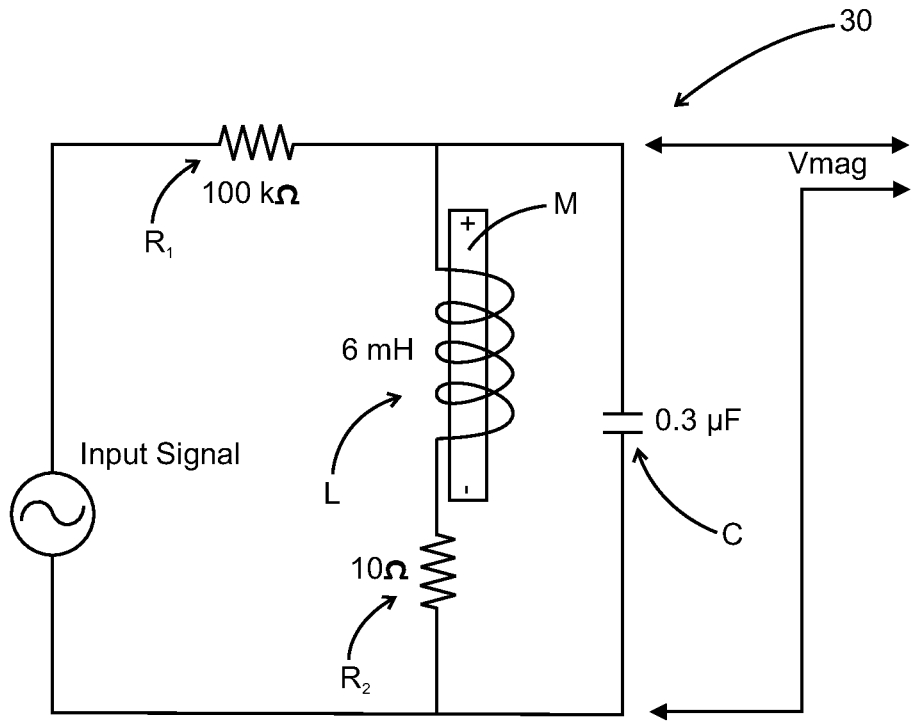
FIG. 3B is a circuit diagram of an RLC circuit according to an exemplary embodiment.

For example, referring to FIG. 3A is shown the magnetic response of a portion of an exemplary battery cell e.g., including a lithium iron phosphate cathode, as a function of temperature. In an exemplary embodiment, the magnetic response of the battery cell may be a voltage (e.g., $V_{mag}$) or impedance determined according to a resonant RLC circuit e.g., 30, shown in FIG. 3B, placed proximate a magnetic material, e.g., M. In one embodiment, the values of $R_1$ (a first Resistance), $R_2$ (a second Resistance), L (inductance), and C (capacitance), may depend on the characteristics of the RLC circuit as well as the magnetic response of the material being measured. In another embodiment, the RLC circuit e.g., 30 may be tunable to a selected resonance frequency prior to or during measurement of the magnetic response of the battery cell.

Referring to FIG. 3A, it can be seen that the magnetic response (measured magnetic property value) e.g., at a given magnetic field value and at a particular state of charge (SOC) value (e.g., 60% (A), 80% (B), and 100% (C)), may have an inverse relationship with temperature. In some embodiments, the inverse temperature relationship may be expressed according to the Curie law; e.g., Vmag=C/T+Vo where C is a Curie constant for a specific magnetic (e.g., paramagnetic) material and Vo is a constant. In some embodiments the magnetic response value may be representative of magnetic susceptibility. In other embodiments a magnetic response value of a ferromagnetic material may have an inverse temperature relationship according to the Curie-Weiss law as is known in the art.

Thus, referring back to FIG. 2A, in one embodiment, a state of charge (SOC) of the battery cell may be determined by a software implemented state of charge (SOC) estimator by using as input, a temperature compensated magnetic property value (e.g., corrected for temperature dependent response of magnetic electrode material) derived from a measured magnetic property supplied by magnetic response sensor e.g., 16. As noted above, the temperature compensated magnetic property value may be used as an input to an SOC estimator alone or in combination with one or more of voltage, current, and temperature measurement of one or more battery cells of a battery system, in order to determined an SOC of the battery system.

Figure 2B:
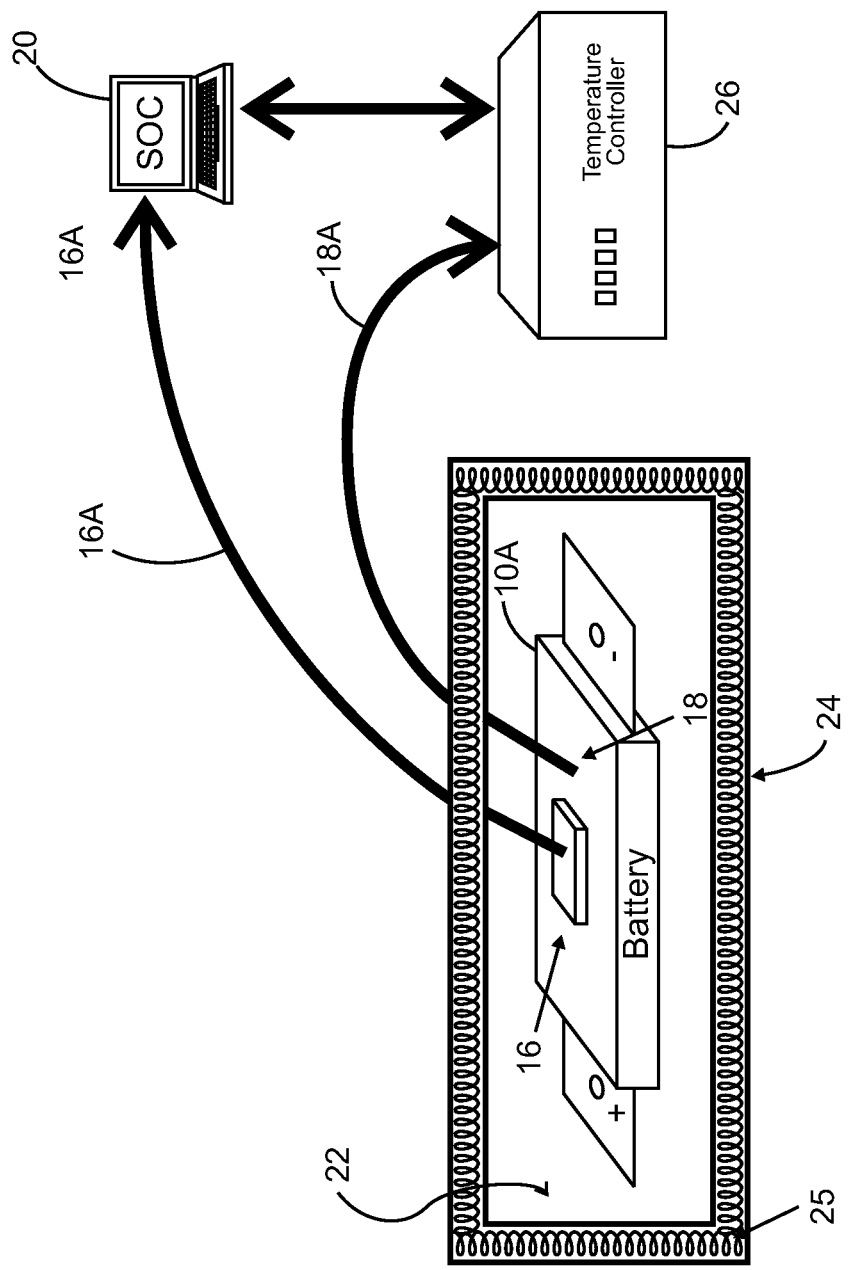
FIG. 2B is a schematic view of an exemplary lithium ion battery cell/battery system including magnetic and temperature sensors within a temperature controlled environment according to an exemplary embodiment.

Referring to FIG. 2B, in some embodiments, the battery system 10 including battery cell 10A may be enclosed in or proximate a temperature controlled environment 22. In one embodiment, the temperature controlled environment may be controlled by an external temperature control device e.g., 24 e.g., including heating and/or cooling capability e.g., heating and/or cooling elements 25. In some embodiments, the temperature control device e.g., 24 may be controlled in response to a battery temperature sensed by one or more temperature sensors e.g., 18. In one embodiment, a separate temperature controller e.g., 26 may be provided in communication the temperature control device e.g., 24 to control the temperature of the temperature controlled environment 22. As shown in FIG. 2B, a response signal 18A from the temperature sensor 18 may be delivered to the separate temperature controller 26, and a response signal 16A from the magnetic response sensor 18 may be delivered to the controller 20. In some embodiments, the battery system temperature may be controlled at a known (e.g., constant) value without the necessity of temperature compensation of a magnetic property measurement. In other embodiments, the battery system temperature may be controlled at one or more temperatures in combination with temperature compensation (correction) of a measured magnetic property measurement e.g., by magnetic sensor 16 and controller 20, which may then be used as input to an SOC estimator (e.g., program executed by controller 20) to determine an SOC of the battery cell 10A and/or battery system 10.

Figure 2C:
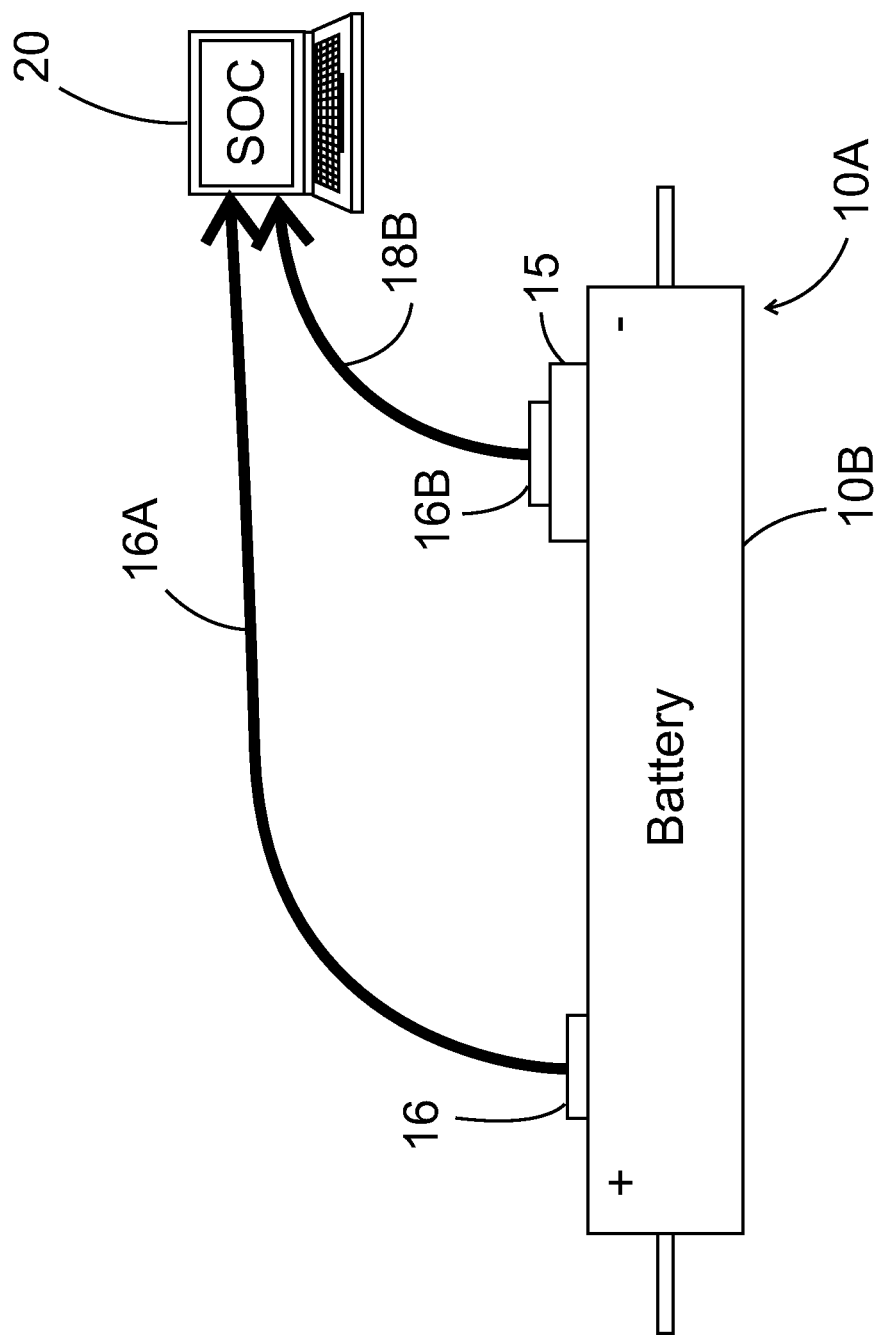
FIG. 2C is a schematic view of an exemplary lithium ion battery cell including magnetic and temperature sensors according to an exemplary embodiment.

Referring to FIG. 2C, in another embodiment, second (one or more) magnetic response sensors e.g., 16B may be provided proximate (e.g., physically contacting) a separate magnetic electrode material structure 15 (e.g., lithium iron phosphate) in thermal equilibrium e.g., physically attached to an external portion 10B of a battery cell, e.g., 10A. In one embodiment, the separate structure of magnetic electrode material 15 may be placed in thermal equilibrium (e.g., in good thermal contact with) the battery cell 10A to provide a second (reference) magnetic property value measurement 18B by second magnetic property sensor e.g., 16B. As shown in FIG. 2C, a response signal 16A from the magnetic response sensor 18 may be delivered to the controller 20.

In one embodiment, the second (reference) magnetic property value measurement 18B may be independent of SOC of the battery cell 10A while being dependent on a temperature of the battery cell 10A. It will be appreciated that the first magnetic response sensor e.g., 16, which may be in thermal equilibrium with the battery cell, may provide a first magnetic property value measurement that may be dependent on SOC of the battery cell while also being dependent on a temperature of the battery cell.

Thus, in one embodiment, the second (one or more) magnetic response sensors e.g., 16B may provide a SOC-independent magnetic response (reference signal) which may be used to correct (compensate) the first magnetic response sensor e.g., 16, and where the temperature compensated magnetic response value may then be used for SOC determination. In other embodiments, the reference signal (e.g., from magnetic response sensor 16B) including a temperature compensated magnetic response value may be used alone or in combination with temperature compensation with a known magnetic response versus temperature relationship of the battery cell (e.g., Curie law) with respect to magnetic electrode material in battery cell, to determine and SOC of the battery cell/battery system.

Figure 4:
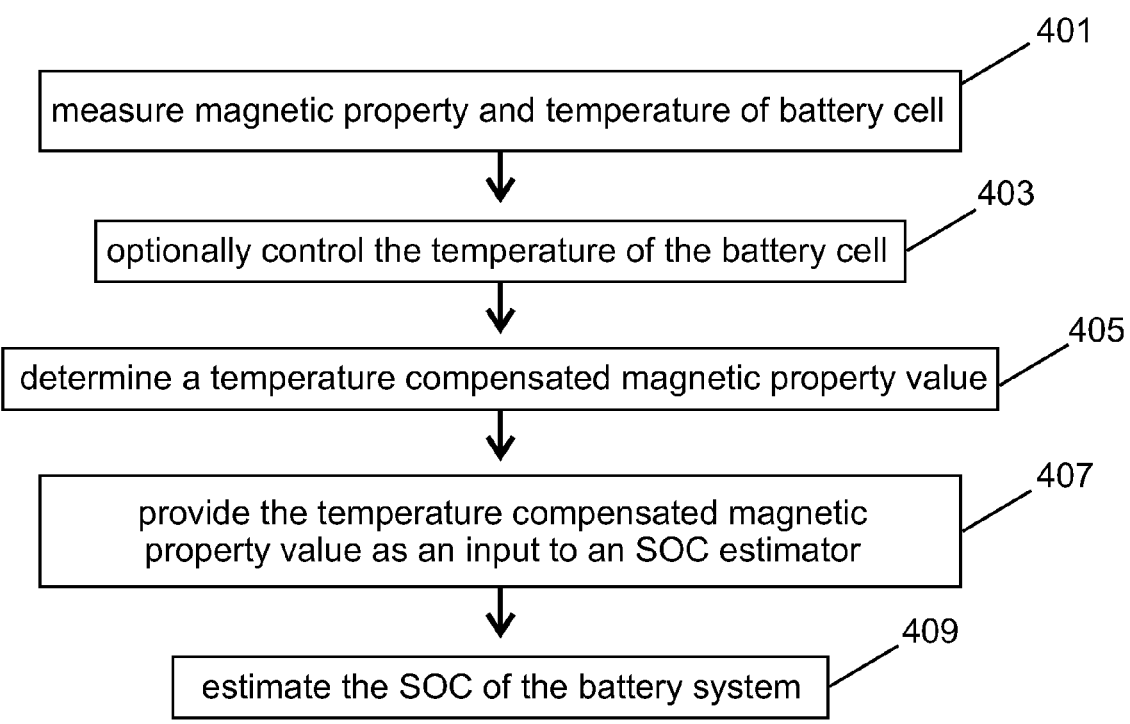
FIG. 4 shows an exemplary process flow according to exemplary embodiments.

Referring to FIG. 4 is a process flow diagram according to embodiments. In step 401a magnetic property and a temperature of a battery cell (system) may be measured. In step 403 the temperature of the battery cell may be controlled in response to the temperature measurement at one or more temperatures. In step 405 a temperature compensated magnetic property value may be determined based on the measured temperature of the battery cell and/or on a reference magnetic property value independent of SOC (e.g., second magnetic material independent of battery operation in thermal equilibrium with battery). In step 407 the temperature compensated magnetic property value may be used as an input to an SOC estimator. In step 409, an SOC of the battery system is estimated using the temperature compensated magnetic property value.

The above description of embodiments of the invention is merely exemplary in nature and, thus, variations thereof are not to be regarded as a departure from the spirit and scope of the invention.

What is claimed is:

1. A battery system comprising:
    a battery cell comprising a magnetic material;
    a magnetic property sensor proximate said magnetic material to sense a temperature dependent magnetic property value of said magnetic material, said magnetic property sensor in communication with a controller;
    a temperature sensor proximate said magnetic material to sense a temperature, said temperature sensor in communication with a controller;
    wherein said controller comprises software to determine a temperature compensated magnetic property value from said temperature dependent magnetic property value.

2. The battery system of claim 1, wherein said controller further comprises software to determine a state of charge (SOC) using said temperature compensated magnetic property value.

3. The battery system of claim 1, wherein said controller further comprises software to control a temperature environment of said battery system.

4. The battery system of claim 1, further comprising a temperature controller in communication said temperature sensor and in communication with a temperature control device proximate said battery cell, said temperature controller programmed to control a temperature of said battery cell.

5. The battery system of claim 1, wherein said magnetic material is an electrode material comprising said battery cell.

6. The battery system of claim 1, wherein said magnetic material is a lithium containing electrode material comprising said battery cell.

7. The battery system of claim 1, wherein said magnetic property sensor and said temperature sensor are in thermal equilibrium with an external portion of said battery cell.

8. The battery system of claim 1, wherein said magnetic property sensor and said temperature sensor are in physical contact with an external portion of said battery cell.

9. A battery system comprising:
    a battery cell comprising a magnetic material;
    a magnetic property sensor proximate said magnetic material to sense a temperature dependent magnetic property value of said magnetic material, said magnetic property sensor in communication with a controller;
    a temperature sensor proximate said magnetic material to sense a temperature, said temperature sensor in communication with a controller;

wherein said controller comprises software to determine a temperature compensated magnetic property value from said temperature dependent magnetic property value, and further comprising a second magnetic property sensor proximate a second magnetic material, said second magnetic material the same as said first magnetic material, said second magnetic property sensor in communication with said controller, said second magnetic material in thermal equilibrium with said battery cell, said magnetic response of said second magnetic material providing a reference magnetic property value independent of a state of charge (SOC) of said battery cell to determine said temperature compensated magnetic property value.

10. The battery system of claim 9, wherein said second magnetic material comprises electrode material in physical contact with an external portion of said battery cell.

11. The battery system of claim 10, wherein said second magnetic material comprises a lithium-containing material.

12. A method of determining a state of charge (SOC) of a battery system comprising:
   determining a temperature dependent magnetic property value of a magnetic material proximate a battery cell, said magnetic property value dependent on a state of charge (SOC) of said battery cell;
   determining a temperature of said magnetic material;
   determining a temperature compensated magnetic material value from said temperature dependent magnetic property value; and,
   using said temperature compensated magnetic material value as an input to a state of charge (SOC) estimator to determine a state of charge (SOC) of said battery system.

13. The method of claim 12, further comprising determining a temperature of said magnetic material and using said temperature to control a temperature of said battery system.

14. The method of claim 12, further comprising determining a temperature of said magnetic material and using said temperature to determine said temperature compensated magnetic property value.

15. The method of claim 12, wherein said magnetic material is an electrode material comprising said battery cell.

16. The method of claim 12, wherein said magnetic material is a lithium containing electrode material comprising said battery cell.

17. The method of claim 12, wherein said temperature dependent magnetic property value and said temperature is determined by a magnetic sensor and a temperature sensor in thermal equilibrium with said battery cell.

18. A method of determining a state of charge (SOC) of a battery system comprising:
   determining a temperature dependent magnetic property value of a magnetic material proximate a battery cell, said magnetic property value dependent on a state of charge (SOC) of said battery cell;
   determining a temperature of said magnetic material;
   determining a temperature compensated magnetic material value from said temperature dependent magnetic property value; and,
   using said temperature compensated magnetic material value as an input to a state of charge (SOC) estimator to determine a state of charge (SOC) of said battery system, and further comprising determining a temperature dependent reference magnetic property value of a second magnetic material substantially the same as said first magnetic material, wherein said reference magnetic property value is independent of a state of charge (SOC) of said battery cell while being in thermal equilibrium with said battery cell and wherein said temperature dependent reference magnetic property value is used to determine said temperature compensated magnetic property value.

19. The method of claim 18, wherein said second magnetic material comprises electrode material in physical contact with an external portion of said battery cell.

20. A method of determining a state of charge (SOC) of a battery system comprising:
   determining a temperature dependent magnetic property value of a first magnetic material proximate a battery cell, said temperature dependent magnetic property value dependent on a state of charge (SOC) of said battery cell;
   determining a temperature dependent reference magnetic property value of a second magnetic material, said reference magnetic property value independent of a state of charge (SOC) of said battery cell, said second magnetic material substantially the same as said first magnetic material, said second magnetic material in thermal equilibrium with said battery cell;
   determining a temperature compensated value of said magnetic material; and,
   using said temperature compensated value as an input to a state of charge (SOC) estimator to determine a state of charge (SOC) of said battery system.

* * * * *